United States Patent
Hsu

(10) Patent No.: US 7,101,208 B2
(45) Date of Patent: Sep. 5, 2006

(54) DEVICE FOR DETECTING MALFUNCTIONED POWER CABLE IN COMPUTER WITHOUT USING METER

(76) Inventor: Sam Hsu, No. 13, Alley 86, Lane 412, Jennshin Rd., Taichung City (TW)

( * ) Notice: Subject to any disclaimer, the term of this patent is extended or adjusted under 35 U.S.C. 154(b) by 0 days.

(21) Appl. No.: 10/881,827

(22) Filed: Jun. 29, 2004

(65) Prior Publication Data

US 2005/0287857 A1  Dec. 29, 2005

(51) Int. Cl.
*H01R 13/02* (2006.01)

(52) U.S. Cl. .................................... 439/225

(58) Field of Classification Search ........... 439/225, 439/490
See application file for complete search history.

(56) References Cited

U.S. PATENT DOCUMENTS 2,449,150 A * 9/1948 Schnoll .................. 340/656

* cited by examiner

*Primary Examiner*—Javaid H. Nasri
(74) *Attorney, Agent, or Firm*—Pro-Techtor Int'l Services

(57) ABSTRACT

A device is provided to detect whether a power cable having two four-pin connectors in a computer is malfunctioned or not without using a meter. In one embodiment, the device comprises a pair of positive and negative apertures and a LED. In a coupled state of the detection device and one connector of the power cable, the positive aperture is put on the first positive pin and the negative aperture is put on the first negative pin so as to electrically couple the device to the power cable for causing the LED to emit light if the electrical connection of a 5V power cable portion of the power cable is not broken. In another embodiment, electrical connections of both 5V and 12V power cable portions of the power cable can be detected.

4 Claims, 7 Drawing Sheets

DEVICE FOR DETECTING MALFUNCTIONED POWER CABLE IN COMPUTER WITHOUT USING METER

FIELD OF THE INVENTION

The present invention relates to detection devices and more particularly to a simple device for detecting a malfunctioned power cable at its connector in a personal computer without using a meter.

BACKGROUND OF THE INVENTION

Conventionally, a user may use a meter or ask a technician to check malfunctioned power cables in a computer for removing the problem. For the former case, a meter is required. For the latter case, the charge of consulting a technician for help is not cheap. Further, an experienced technician may not come to help immediately when the computer problem occurs. Thus, the need for providing a simple, cheap device for detecting a malfunctioned power cable at its connector in a computer without using a meter exists.

SUMMARY OF THE INVENTION

It is an object of the present invention to provide a device for detecting whether a power cable having two four-pin connectors in a computer is malfunctioned or not without using a meter, either connector having a first positive pin as a positive pin of a 12V power cable portion of the power cable, a first negative pin as a negative pin of the 12V power cable portion, a second positive pin as a positive pin of a 5V power cable portion of the power cable, and a second negative pin as a negative pin of the 5V power cable portion, comprising a circular positive section; a positive aperture enclosed by the positive section; a positive connection having one end electrically coupled to the positive section; a circular negative section electrically coupled to the other end of the positive connection; a negative aperture enclosed by the negative section; a resistor provided on the positive connection; a light-emitting member provided on the positive connection; and first and second apertures proximate the negative aperture; wherein in a coupled state of the detection device and one connector of the power cable, the positive aperture is put on the first positive pin, the negative aperture is put on the first negative pin, the second aperture is put on the second negative pin, and the first aperture is put on the second positive pin so as to electrically couple the first positive pin to the positive section and electrically couple the first negative pin to the negative section, thereby causing the light-emitting member to emit light if the electrical connection of the 5V power cable portion is not broken.

It is another object of the present invention to provide a device for detecting whether a power cable having two four-pin connectors in a computer is malfunctioned or not without using a meter, either connector having a first positive pin as a positive pin of a 12V power cable portion of the power cable, a first negative pin as a negative pin of the 12V power cable portion, a second positive pin as a positive pin of a 5V power cable portion of the power cable, and a second negative pin as a negative pin of the 5V power cable portion, comprising a circular first positive section; a first positive aperture enclosed by the first positive section; a first positive connection having one end electrically coupled to the first positive section; a circular first negative section electrically coupled to the other end of the first positive connection; a first negative aperture enclosed by the first negative section; a first resistor provided on the first positive connection; a first light-emitting member provided on the first positive connection, the first light-emitting member being capable of emitting light of a first color; a circular second positive section distal from the first positive section; a second positive aperture enclosed by the second positive section; a second positive connection having one end electrically coupled to the second positive section; a circular second negative section electrically coupled to the other end of the second positive connection; a second negative aperture enclosed by the second negative section; a second resistor provided on the second positive connection; and a second light-emitting member provided on the second positive connection, the second light-emitting member being capable of emitting light of a second color different the first color; wherein in a coupled state of the detection device and one connector of the power cable, the first positive aperture is put on the first positive pin, the first negative aperture is put on the first negative pin, the second negative aperture is put on the second negative pin, and the second positive aperture is put on the second positive pin so as to electrically couple the first positive pin to the first positive section, electrically couple the first negative pin to the first negative section, electrically couple the second positive pin to the second positive section, and electrically couple the second negative pin to the second negative section, thereby causing the first light-emitting member to emit light of first color if the electrical connection of the 12V power cable portion is not broken, and causing the second light-emitting member to emit light of second color if the electrical connection of the 5V power cable portion is not broken.

In one aspect of the present invention, each of the light-emitting members is a LED.

The above and other objects, features and advantages of the present invention will become apparent from the following detailed description taken with the accompanying drawings.

DETAILED DESCRIPTION OF THE PREFERRED EMBODIMENTS

Figure 1:
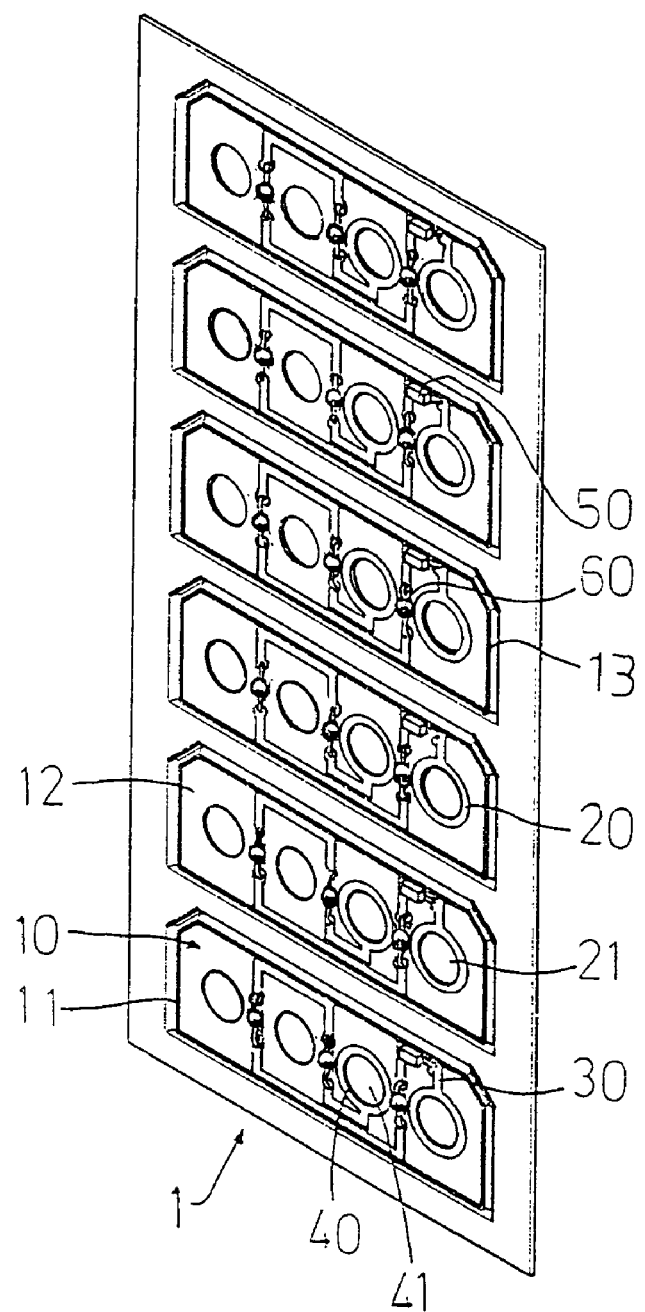
FIG. 1 is a perspective view of a plastic board having a plurality of detection devices according to a first preferred embodiment of the invention formed thereon prior to separation.
Figure 2:
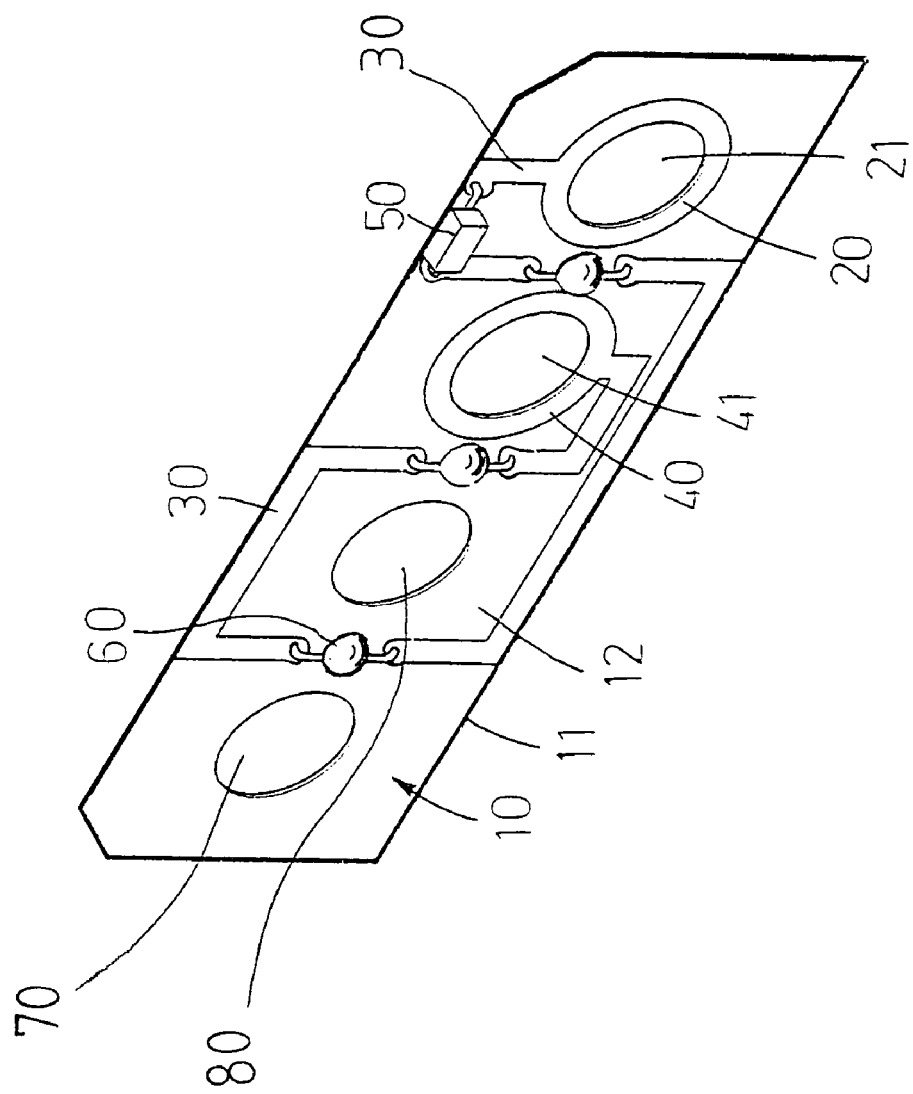
FIG. 2 is a greatly enlarged view of the detection device.
Figure 3:
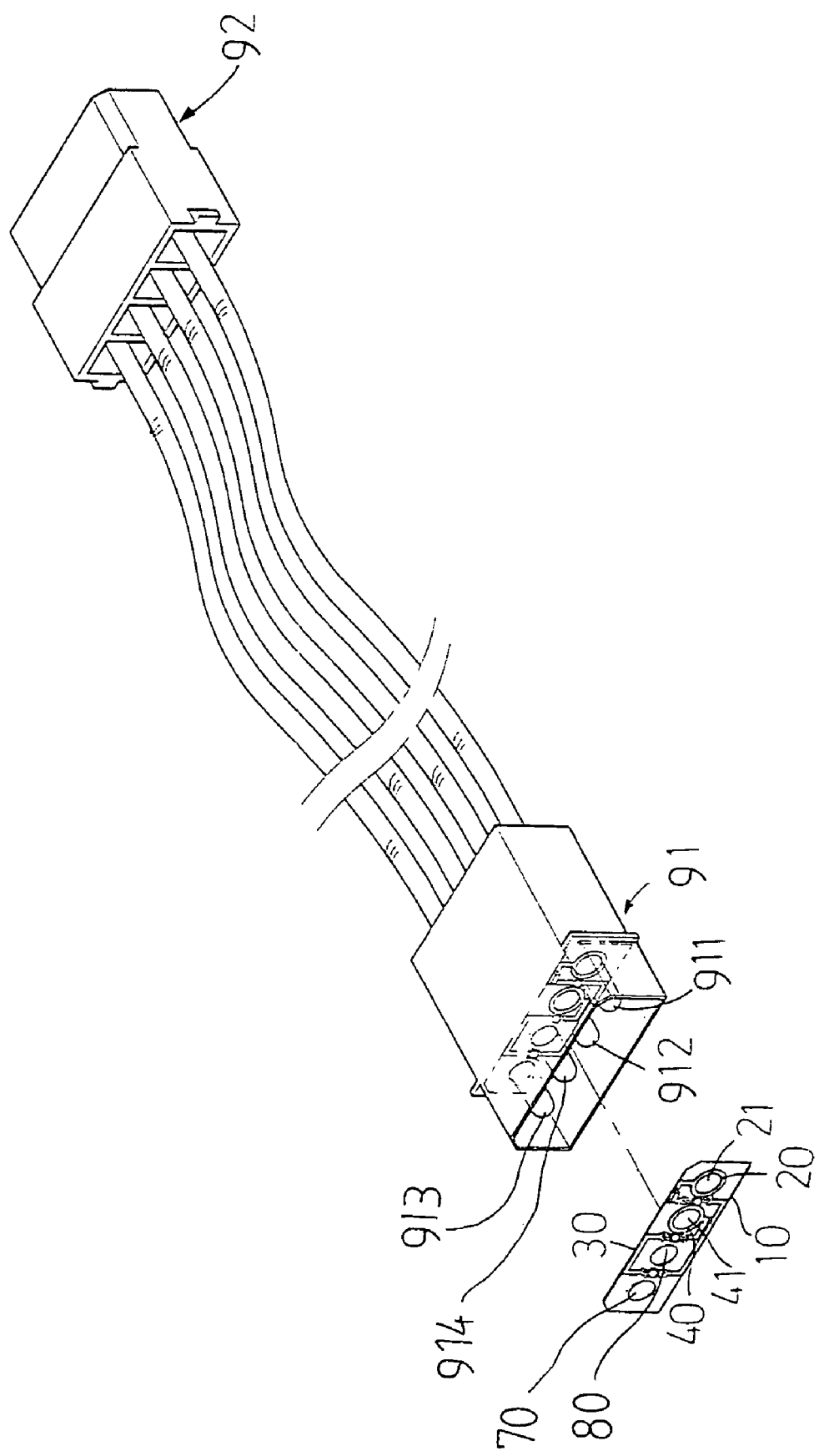
FIG. 3 is a perspective of the detection device to be attached to the connector of a power cable in a computer.

Referring to FIGS. 1 to 5, there is shown a detection device 10 constructed in accordance with a first preferred embodiment of the invention. A plurality of detection devices 10 are formed on a plurality of areas 13 of a plastic board 1 prior to separation by cutting along the edge of each area 13. The elongated detection device 10 comprises a rectangular edge 11, an attachment surface 12 enclosed by the edge 11, a circular positive section 20 provided on the attachment surface 12, a positive aperture 21 enclosed by the positive section 20, a positive connection 30 formed of a printed circuit and having one end electrically coupled to the positive section 20, a circular negative section 40 provided on the attachment surface 12, the negative section 40 being electrically coupled to the other end of the positive connection 30, a negative aperture 41 enclosed by the negative section 40, a resistor 50 provided on the positive connection 30, a light-emitting member (e.g., LED (light-emitting diode)) 60 provided on the positive connection 30, and first and second apertures 70 and 80 proximate the negative aperture 41.

In use (see FIGS. 3, 4 and 5), attach the detection device 10 to one four-pin male header connector 91 of a power cable with four apertures 21, 41, 70, and 80 being put on four pins 911, 912, 913, and 194 of the connector 91 in which the positive aperture 21 is put on the first positive pin 911, the negative aperture 41 is put on the first negative pin 912, the second aperture 80 is put on the second negative pin 914, and the first aperture 70 is put on the second positive pin 913 respectively. The second positive and negative pins 913 and 914 are used as positive and negative pins of the 5V power cable. Also, The first positive and negative pins 911 and 912 are used as positive and negative pins of the 12V power cable. That is, the 5V and 12 V power cables are formed integrally as a single power cable. After the connection, the first positive pin 911 is electrically coupled to the positive section 20 and the first negative pin 912 is electrically coupled to the negative section 40 respectively.

Figure 4:
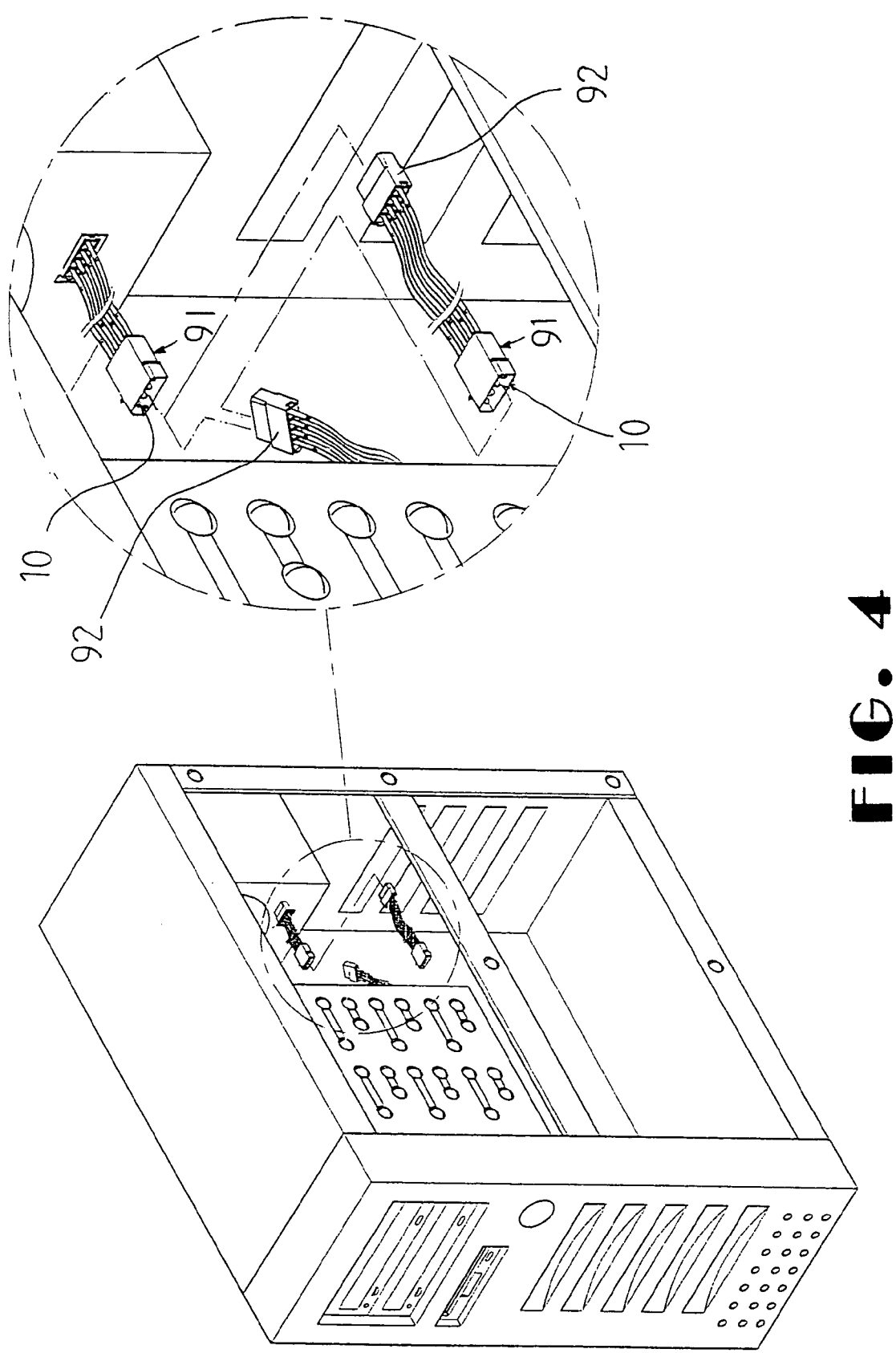
FIG. 4 is a perspective view of a couple of detection devices each mounted at the connector of a power cable in a computer.
Figure 5:
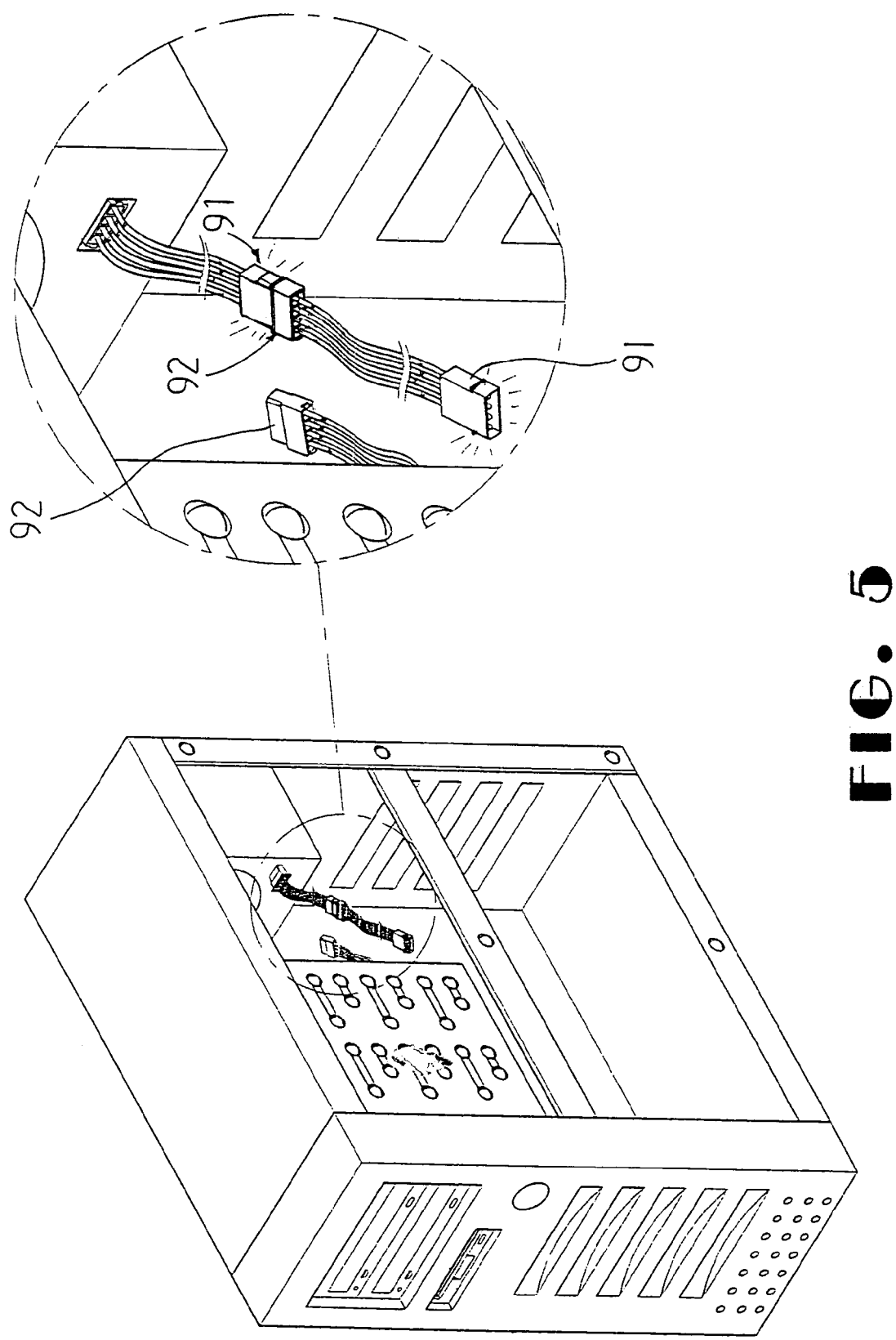
FIG. 5 is a view similar to FIG. 4, where one power cable is coupled to another power cable extended from a power supply of the computer.

In the case shown in FIGS. 4 and 5, two detection devices 10 are attached to one connectors 91 of two power cables. Next, attach the other connector 92 of one power cable to one connector 91 (already coupled with one detection device 10) of another power cable extended from a power supply of the computer and attach one connector 91 (already coupled with the other detection device 10) of one power cable to the other connector 92 of still another power cable extended from a component (e.g., hard disk drive) of the computer. The light-emitting member 60 will emit light from either connector 91 if the electrical connection is not broken. Thereafter, a user may determine whether the connection is normal or not. In other words, the user can determine that one power cable is malfunctioned if no light is emitted from one connector 91 thereof. This is a quick, simple, and effective method of detecting any malfunctioned power cables.

Figure 6:
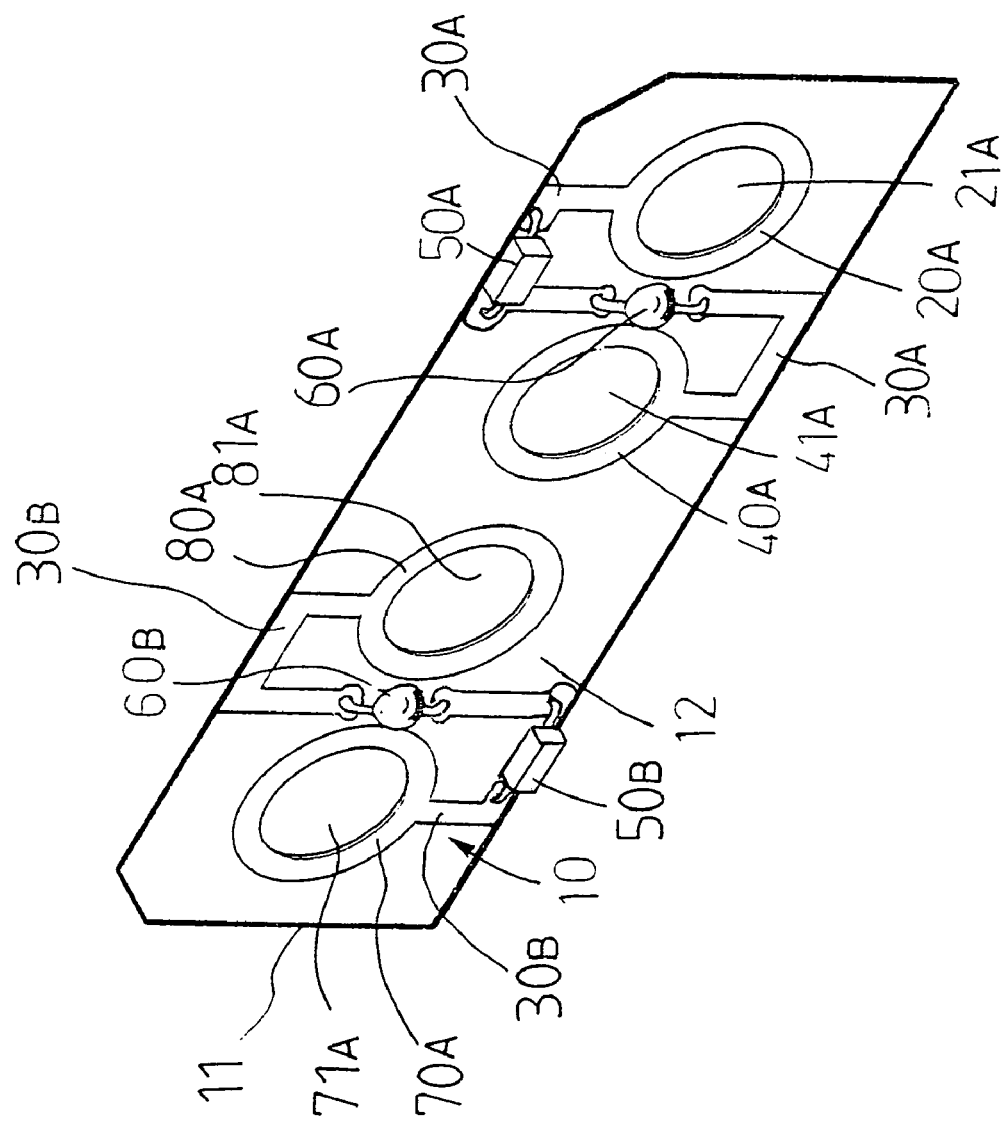
FIG. 6 is a perspective view of a second preferred embodiment of detection device according to the invention.
Figure 7:
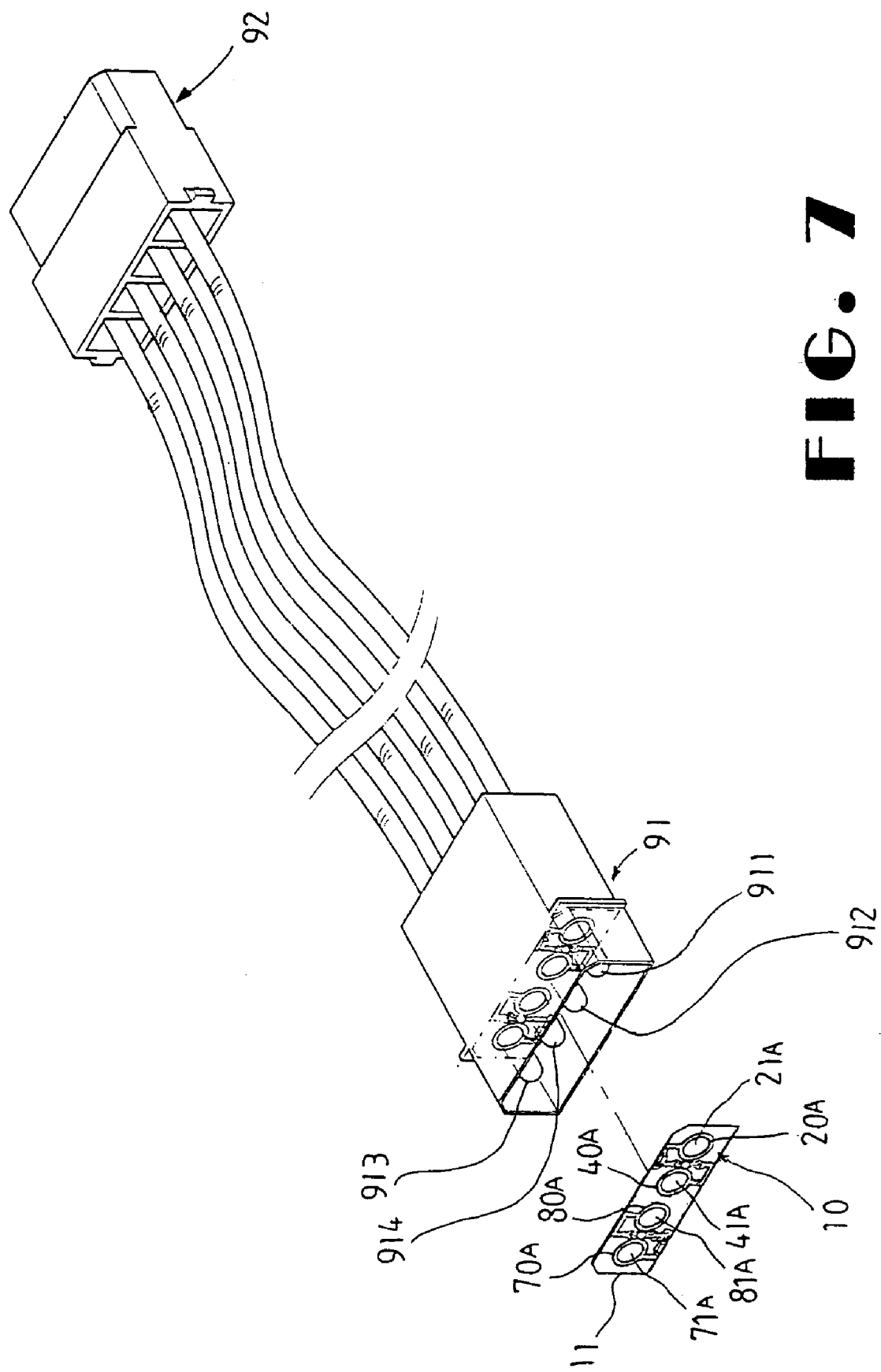
FIG. 7 is a perspective view of the detection device shown in FIG. 6 to be attached to the connector of the power cable.

Referring to FIGS. 6 and 7, there is shown a detection device 10 constructed in accordance with a second preferred embodiment of the invention. The second preferred embodiment substantially has same structure as the first preferred embodiment. The characteristics of the second preferred embodiment are detailed below. The elongated detection device 10 comprises a rectangular edge 11, an attachment surface 12 enclosed by the edge 11, a circular first positive section 20A provided on the attachment surface 12, a first positive aperture 21A enclosed by the first positive section 20A, a first positive connection 30A formed of a printed circuit and having one end electrically coupled to the first positive section 20A, a circular first negative section 40A provided on the attachment surface 12, the first negative section 40A being electrically coupled to the other end of the first positive connection 30A, a first negative aperture 41A enclosed by the first negative section 40A, a first resistor 50A provided on the first positive connection 30A, a first light-emitting member (e.g., LED (light-emitting diode)) 60A provided on the first positive connection 30A, a circular second positive section 70A provided on the attachment surface 12, a second positive aperture 71A enclosed by the second positive section 70A, a second positive connection 30B formed of a printed circuit and having one end electrically coupled to the second positive section 70A, a circular second negative section 80A provided on the attachment surface 12, the second negative section 80A being electrically coupled to the other end of the second positive connection 30B, a second negative aperture 81A enclosed by the second negative section 80A, a second resistor 50B provided on the second positive connection 30B, and a second light-emitting member (e.g., LED (light-emitting diode)) 60B provided on the second positive connection 30B, the second light-emitting member 60B being capable of emitting light having a color (e.g., blue) different from that (e.g., red) of the first light-emitting member 60A.

In use, attach the detection device 10 to one four-pin male header connector 91 of a power cable with four apertures 21A, 41A, 81A, and 71A being put on four pins 911, 912, 914, and 193 of the connector 91 in which the first positive aperture 21A is put on the first positive pin 911, the first negative aperture 41A is put on the first negative pin 912, the second negative aperture 81A is put on the second negative pin 914, and the second positive aperture 71A is put on the second positive pin 913 respectively. The second positive and negative pins 913 and 914 are used as positive and negative pins of 5V power cable and the first positive and negative pins 911 and 912 are used as positive and negative pins of 12V power cable respectively. After the connection, the first positive pin 911 is electrically coupled to the first positive section 20A, the first negative pin 912 is electrically coupled to the first negative section 40A, the second positive pin 913 is electrically coupled to the second positive section 70A, and the second negative pin 914 is electrically coupled to the second negative section 80A respectively.

Likewise, two detection devices 10 are attached to one connectors 91 of two power cables. Next, attach the other connector 92 of one power cable to one connector 91 (already coupled with one detection device 10) of another power cable extended from a power supply of the computer and attach one connector 91 (already coupled with the other detection device 10) of one power cable to the other connector 92 of still another power cable extended from a component (e.g., hard disk drive) of the computer. The first light-emitting member 60A will emit red light from either connector 91 if the electrical connection of 12V power cable is not broken. Also, the second light-emitting member 60B will emit blue light from the same connector 91 if the electrical connection of 5V power cable is not broken. Thereafter, a user may determine whether the connection of 5V or 12V power cable is normal or not. In other words, the user can determine that the 12V power cable is malfunctioned if red light is not emitted from one connector 91 thereof and the 5V power cable is malfunctioned if blue light is not emitted from the same connector 91 thereof. This is a quick, simple, and effective method of detecting any malfunctioned power cables.

While the invention herein disclosed has been described by means of specific embodiments, numerous modifications and variations could be made thereto by those skilled in the art without departing from the scope and spirit of the invention set forth in the claims.

What is claimed is:

1. A device for detecting whether a power cable having two four-pin connectors in a computer is malfunctioned or not without using a meter, either connector having a first positive pin as a positive pin of a 12V power cable portion of the power cable, a first negative pin as a negative pin of the 12V power cable portion, a second positive pin as a positive pin of a 5V power cable portion of the power cable, and a second negative pin as a negative pin of the 5V power cable portion, comprising:

a circular positive section;
a positive aperture enclosed by the positive section;
a positive connection having one end electrically coupled to the positive section;
a circular negative section electrically coupled to the other end of the positive connection;
a negative aperture enclosed by the negative section;
a resistor provided on the positive connection;
a light-emitting member provided on the positive connection; and
first and second apertures proximate the negative aperture;
wherein in a coupled state of the detection device and one connector of the power cable, the positive aperture is put on the first positive pin, the negative aperture is put on the first negative pin, the second aperture is put on the second negative pin, and the first aperture is put on the second positive pin so as to electrically couple the first positive pin to the positive section and electrically couple the first negative pin to the negative section, thereby causing the light-emitting member to emit light if the electrical connection of the 5V power cable portion is not broken.

2. The device of claim 1, wherein the light-emitting member is a LED.

3. A device for detecting whether a power cable having two four-pin connectors in a computer is malfunctioned or not without using a meter, either connector having a first positive pin as a positive pin of a 12V power cable portion of the power cable, a first negative pin as a negative pin of the 12V power cable portion, a second positive pin as a positive pin of a 5V power cable portion of the power cable, and a second negative pin as a negative pin of the 5V power cable portion, comprising:

a circular first positive section;
a first positive aperture enclosed by the first positive section;
a first positive connection having one end electrically coupled to the first positive section;
a circular first negative section electrically coupled to the other end of the first positive connection;
a first negative aperture enclosed by the first negative section;
a first resistor provided on the first positive connection;
a first light-emitting member provided on the first positive connection, the first light-emitting member being capable of emitting light of a first color;
a circular second positive section distal from the first positive section;
a second positive aperture enclosed by the second positive section;
a second positive connection having one end electrically coupled to the second positive section;
a circular second negative section electrically coupled to the other end of the second positive connection;
a second negative aperture enclosed by the second negative section;
a second resistor provided on the second positive connection; and
a second light-emitting member provided on the second positive connection, the second light-emitting member being capable of emitting light of a second color different than the first color;
wherein in a coupled state of the detection device and one connector of the power cable, the first positive aperture is put on the first positive pin, the first negative aperture is put on the first negative pin, the second negative aperture is put on the second negative pin, and the second positive aperture is put on the second positive pin so as to electrically couple the first positive pin to the first positive section, electrically couple the first negative pin to the first negative section, electrically couple the second positive pin to the second positive section, and electrically couple the second negative pin to the second negative section, thereby causing the first light-emitting member to emit light of first color if the electrical connection of the 12V power cable portion is not broken, and causing the second light-emitting member to emit light of second color if the electrical connection of the 5V power cable portion is not broken.

4. The device of claim 3, wherein each of the first and second light-emitting members is a LED.

* * * * *